United States Patent
Horimoto et al.

(10) Patent No.: US 8,921,989 B2
(45) Date of Patent: Dec. 30, 2014

(54) POWER ELECTRONICS MODULES WITH SOLDER LAYERS HAVING REDUCED THERMAL STRESS

(71) Applicant: Toyota Motor Engineering & Manufacturing North America, Inc., Erlanger, KY (US)

(72) Inventors: Shuhei Horimoto, Miyoshi (JP); Ercan Mehmet Dede, Ann Arbor, MI (US); Tsuyoshi Nomura, Ann Arbor, MI (US)

(73) Assignee: Toyota Motor Engineering & Manufacturing North, America, Inc., Erlanger, KY (US)

( * ) Notice: Subject to any disclaimer, the term of this patent is extended or adjusted under 35 U.S.C. 154(b) by 0 days.

(21) Appl. No.: 13/851,738

(22) Filed: Mar. 27, 2013

(65) Prior Publication Data

US 2014/0291696 A1  Oct. 2, 2014

(51) Int. Cl.
*H01L 23/02* (2006.01)
*H01L 23/34* (2006.01)
*H01L 23/48* (2006.01)

(52) U.S. Cl.
CPC ..................... *H01L 23/34* (2013.01)
USPC .......................... 257/678; 257/693

(58) Field of Classification Search
CPC .......... H01L 23/34; H01L 23/02; H01L 23/36
USPC .......... 257/625, 675, 706, 707, 718, 257/E23.001–E23.194
See application file for complete search history.

(56) References Cited

U.S. PATENT DOCUMENTS

| | | | | |
|---|---|---|---|---|
| 5,719,442 | A  * | 2/1998  | Otsuki | 257/712 |
| 6,707,138 | B2 * | 3/2004  | Crowley et al. | 257/676 |
| 6,794,223 | B2   | 9/2004  | Ma et al. | |
| 7,247,514 | B2   | 7/2007  | Yamane et al. | |
| 7,619,302 | B2   | 11/2009 | Hauenstein | |
| 7,875,972 | B2   | 1/2011  | Jadhav et al. | |
| 8,018,056 | B2   | 9/2011  | Hauenstein | |
| 8,247,900 | B2   | 8/2012  | Yuan | |
| 2002/0140067 | A1 * | 10/2002 | Hori | 257/675 |
| 2005/0093131 | A1 * | 5/2005  | Nakase et al. | 257/693 |
| 2006/0138452 | A1 * | 6/2006  | Knapp et al. | 257/177 |
| 2011/0241022 | A1 * | 10/2011 | Masuda | 257/77 |

FOREIGN PATENT DOCUMENTS

JP       2011-023631       3/2011

* cited by examiner

*Primary Examiner* — Armando Rodriguez
*Assistant Examiner* — Mohammed R Alam
(74) *Attorney, Agent, or Firm* — Dinsmore & Shohl LLP

(57) ABSTRACT

Power electronics modules having solder layers with reduced thermal-stress are disclosed. In one embodiment, a power electronics module includes a power electronics device having a first surface, a second surface, a first edge, and a second edge opposite the first edge. The power electronics device has a device length measured from the first edge to the second edge. A first solder layer is adjacent to the first surface of the power electronics device, and a second solder layer is adjacent to the second surface. The first solder layer and the second solder layer have a maximum thickness T along a length that is less than the device length of the power electronics device. A first thermally conductive layer is adjacent to the first solder layer, and a second thermally conductive layer is adjacent to the second solder layer. In some embodiments, the first and second solder layers have tapered portions.

17 Claims, 3 Drawing Sheets

POWER ELECTRONICS MODULES WITH SOLDER LAYERS HAVING REDUCED THERMAL STRESS

TECHNICAL FIELD

The present specification generally relates to power electronics modules and, more particularly, to power electronics modules having solder layers with reduced thermal stress.

BACKGROUND

Power electronics devices, such as power diodes, metal-oxide-semiconductor field-effect transistors (MOSFETs), insulated-gate bipolar transistors (IGBTs), and the like, are utilized in high-current switching applications. For example, an inverter circuit of an electric or hybrid-electric vehicle may utilize such power electronics devices to drive an electric motor to propel a vehicle. Because of the high-current, high-switching demands of the circuit, these power electronics devices may generate significant heat and, therefore, large thermally induced stress. More particularly, thermal stress may be greater in modules wherein the power electronic device is fabricated from silicon carbide rather than silicon because the Young's modulus of silicon carbide is greater than that of silicon. Further power electronics devices fabricated from silicon carbide may be operated at higher temperatures than those fabricated from silicon. Accordingly, strain on the solder layers due to high thermally induced stress may damage the solder layers.

Accordingly, a need exists for alternative power electronics modules having reduced thermal stress in solder layers adjacent to a power electronics device.

SUMMARY

In one embodiment, a power electronics module includes a power electronics device, a first solder layer, a second solder layer, a first thermally conductive layer, and a second thermally conductive layer. The power electronics device includes a first surface, a second surface opposite from the first surface, a first edge, and a second edge opposite the first edge. The power electronics device also has a device length measured from the first edge to the second edge. The first solder layer is adjacent to the first surface of the power electronics device, and the second solder layer is adjacent to the second surface of the power electronics device. The first solder layer and the second solder layer have a maximum thickness T along a length that is less than the device length of the power electronics device. The first thermally conductive layer is adjacent to the first solder layer such that the first solder layer thermally couples the first thermally conductive layer to the first surface of the power electronics device. The second thermally conductive layer is adjacent to the second solder layer such that the second solder layer thermally couples the second thermally conductive layer to the second surface of the power electronics device.

In another embodiment, a power electronics module includes a power electronics device, a first solder layer, a second solder layer, a first thermally conductive layer, a second thermally conductive layer, and a thermally conductive sealing material. The power electronics device includes a first surface, a second surface opposite from the first surface, a first edge, and a second edge opposite the first edge. The power electronics device also has a device length measured from the first edge to the second edge. The first solder layer is adjacent to the first surface of the power electronics device, and has a length that is less than the device length of the power electronics device. The second solder layer is adjacent to the second surface of the power electronics device, and has a length that is less than the device length of the power electronics device. Portions of the power electronics device extend beyond the first solder layer and the second solder layer. The first thermally conductive layer is adjacent to the first solder layer such that the first solder layer thermally couples the first thermally conductive layer to the first surface of the power electronics device. The second thermally conductive layer is adjacent to the second solder layer such that the second solder layer thermally couples the second thermally conductive layer to the second surface of the power electronics device. The thermally conductive sealing material surrounds portions of the power electronics device, the first solder layer, the second solder layer, the first thermally conductive layer, and the second thermally conductive layer.

In yet another embodiment, a power electronics module includes a power electronics device, a first solder layer, a second solder layer, a first thermally conductive layer, a second thermally conductive layer, and a thermally conductive sealing material. The power electronics device includes a first surface, a second surface opposite from the first surface, a first edge, and a second edge opposite the first edge. The first solder layer is adjacent to the first surface of the power electronics device, and a second solder layer adjacent to the second surface of the power electronics device. The first solder layer and the second solder layer each have a maximum thickness T. A thickness of the first solder layer and the second solder layer decreases from the maximum thickness T toward the first edge and the second edge of the power electronics device, thereby defining tapered solder portions on the first surface and the second surface of the power electronics device. The first thermally conductive layer is adjacent to the first solder layer such that the first solder layer thermally couples the first thermally conductive layer to the first surface of the power electronics device. The second thermally conductive layer is adjacent to the second solder layer such that the second solder layer thermally couples the second thermally conductive layer to the second surface of the power electronics device. The thermally conductive sealing material surrounds portions of the power electronics device, the first solder layer, the second solder layer, the first thermally conductive layer, and the second thermally conductive layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments of the present disclosure are directed to power electronics modules having reduced thermally induced stress at solder layers adjacent to a power electronics device (e.g., a semiconductor device) due to high operating temperatures and thermal mismatch between the power electronics device and the solder layers adjacent thereto. More particularly, the embodiments described herein employ a reduced thickness of the solder layers proximate the edges of the power electronics device. For example, in some embodiments, portions of the power electronics device near the perimeter extend beyond the edges of the solder layers such that perimeter portions of the power electronics device are not covered with solder. Accordingly, the solder layers have a surface area that is less than a surface area of the power electronics device. By making the bonded area provided by the solder layers smaller than the power electronics device area, and leaving a small overhang at the edge of the power electronics device, thermally induced maximum stress, which is traditionally located at the corner of the power electronics device, is relieved. Further, in some embodiments, the thickness of the solder layers may be gradually reduced toward the edges of the power electronics device. Various embodiments of power electronics modules will be described in detail below.

Figure 1:
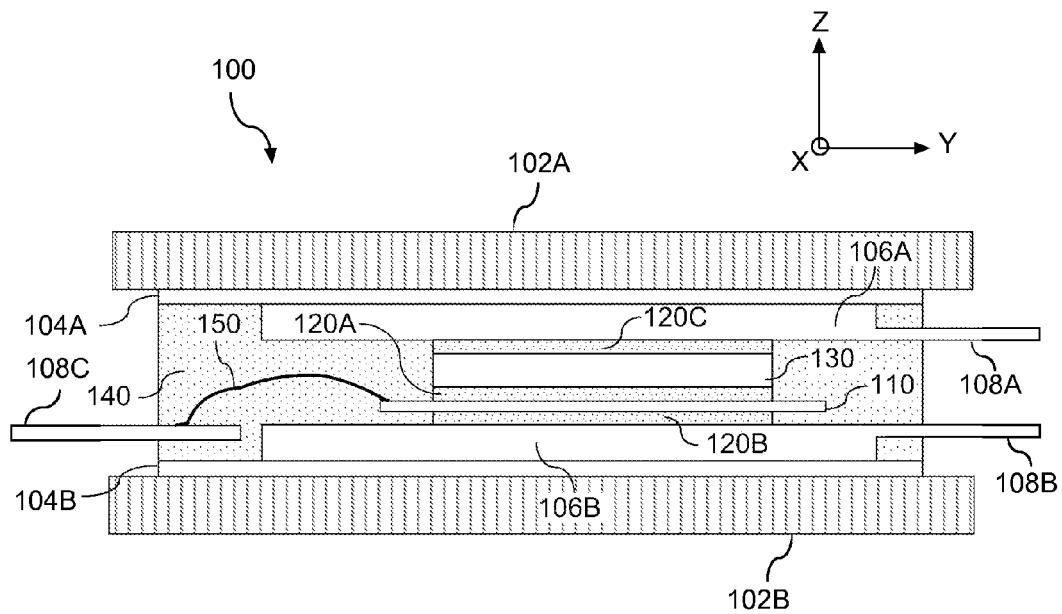
FIG. 1 schematically depicts a cross-sectional view of an exemplary power electronics module according to one or more embodiments described and illustrated herein.

Referring now to FIG. 1, an exemplary power electronics module 100 is schematically depicted in cross-section. The power electronics module 100 may be a component within a larger circuit, such as an inverter circuit for a hybrid vehicle or an electric vehicle, for example. It should be understood that the power electronics module 100 may be implemented in other circuits, and that embodiments are not limited to any particular application. Generally, the illustrated power electronics module 100 includes a power electronics device 110 that is thermally coupled to a first thermally conductive layer configured as a thermally conductive spacer 130, and to a second thermally conductive layer configured as a second heat spreader layer 106B. The thermally conductive spacer 130 is thermally coupled to a first heat spreader layer 106A. The first and second heat spreader layers 106A, 106B, as well as the thermally conductive spacer 130, may be made of any thermally conductive material capable of receiving heat flux generated by the power electronics device 110. Exemplary thermally conductive materials include, but are not limited to, copper and aluminum. It is noted that, in alternative embodiments, the power electronics device 110 may be thermally coupled directly to the first heat spreader layer 106A and not to an intermediate thermally conductive spacer 130. The first and second heat spreader layers 106A, 106B and the thermally conductive spacer 130 act to distribute heat generated by the power electronics device 110.

The power electronics device 110 is thermally coupled to the thermally conductive spacer 130 (or first heat spreader layer 106A) and the second heat spreader layer 106B and by a first solder layer 120A and a second solder layer 120B, respectively. Exemplary materials for the solder layer include, but are not limited to, tin-copper (SnCu) solders and tin-antimony solders (Sn—Sb). As described in more detail below, the first and second solder layers 120A, 120B illustrated in FIG. 1 do not extend fully to the edges of the power electronics device 110, such that portions of the power electronics device 110 overhang the first and second solder layers 120A, 120B. This arrangement may reduce the von Mises stress at the junction of the edge of the first and second solder layers 120A, 120B and the power electronics device 110.

The power electronics device 110 may be configured as any semiconductor device that requires cooling. Exemplary semiconductor devices may include, without limitation, insulated-gate bipolar transistors (IGBTs), reverse-conducting IGBTs, metal-oxide-semiconductor field-effect transistors (MOSFETs), power diodes, transistors, and the like. In some embodiments, the power electronics device 110 is fabricated from silicon carbide (SiC), which has a greater Young's modulus than power electronics devices fabricated from silicon (Si). Because SiC power electronics devices may be operated at higher operating temperatures than Si power electronics devices, and the Young's modulus of SiC power electronics modules is greater than that of Si power electronic devices, the strain of the first and second solder layers 120A, 120B in a SiC power electronics module is greater than that for a Si power electronics module. It should be understood that power electronic devices made from other semiconductor materials, such as GaN, may also be utilized. As described in more detail below, embodiments of the present disclosure reduce the thermally induced strain at the first and second solder layers 120A, 120B by various first and second solder layer configurations.

Still referring to FIG. 1, the thermally conductive spacer 130, if utilized, may also be thermally coupled to the first heat spreader layer 106A by a solder layer 120C. In some embodiments, the first and second heat spreader layers 106A, 106B may be thermally coupled to a first cooler device 102A and a second cooler device 102B, respectively. The first and second cooler devices 102A, 102B may be any cooling device configured to remove heat flux generated by the power electronics device 110 to reduce the maximum temperature of the power electronics device 110. For example, the first and second cooler devices 102A, 102B may be configured as finned heat sinks to remove heat flux by convection. Alternatively, the first and second cooler devices 102A, 102B may be configured as liquid-cooled cooler devices, such as two-phase liquid cooler devices and/or jet-impingement liquid-cooled devices. Any number of cooler device configurations may be used for the first and second cooler devices 102A, 102B. Further, in some embodiments, only one cooler device may be provided.

The first and second cooler devices 102A, 102B may be thermally coupled to the first and second heat spreader layers 106A, 106B by a bond layer 104A, 104B, such as a solder layer. The first and second cooler devices 102A, 102B may also be coupled to the first and second heat spreader layer 106A, 106B by other bonding methods, such as brazing or diffusion bonding. Alternatively, the first and second cooler devices 102A, 102B may be thermally coupled to the first and second heat spreader layers 106A, 106B by application of thermal grease.

In some embodiments, a thermally conductive sealing material 140 (e.g., a thermally conductive epoxy or resin) is disposed (e.g., molded) between the first and second cooler devices 102A, 102B such that is surrounds the first and second heat spreader layers 106A, 106B, the solder layers 120A-120C, the thermally conductive spacer 130 (if present), and the power electronics device 110. In the illustrated embodiment, electrical connectors 108A, 108B, and 108C extend from the thermally conductive sealing material 140. The electrical connectors may be configured as lead frames or wires, for example. The electrical connectors 108A-108C are configured to provide connections for power, control, sensing and feedback, and the like. For example, the power electronics device 110 may have a top surface electrode (not shown) for a first power connection that is electrically coupled to electrical connector 108A via the first heat spreader layer 106A and intervening electrically conductive components, as well as a bottom surface electrode (not shown) that is electrically coupled to electrical connector 108B via the second heat spreader layer 106B and the second solder layer 120B. Electrical connector 108C is depicted as being electrically connected to one or more electrodes (e.g., control electrodes configured to receive drive signals) via a wire bond 150. It should be understood that embodiments described herein are not limited to any particular type of electrical connection configuration. In embodiments, the electrodes may or may not be covered by the first or second solder layers 120A, 120B.

Figure 2:
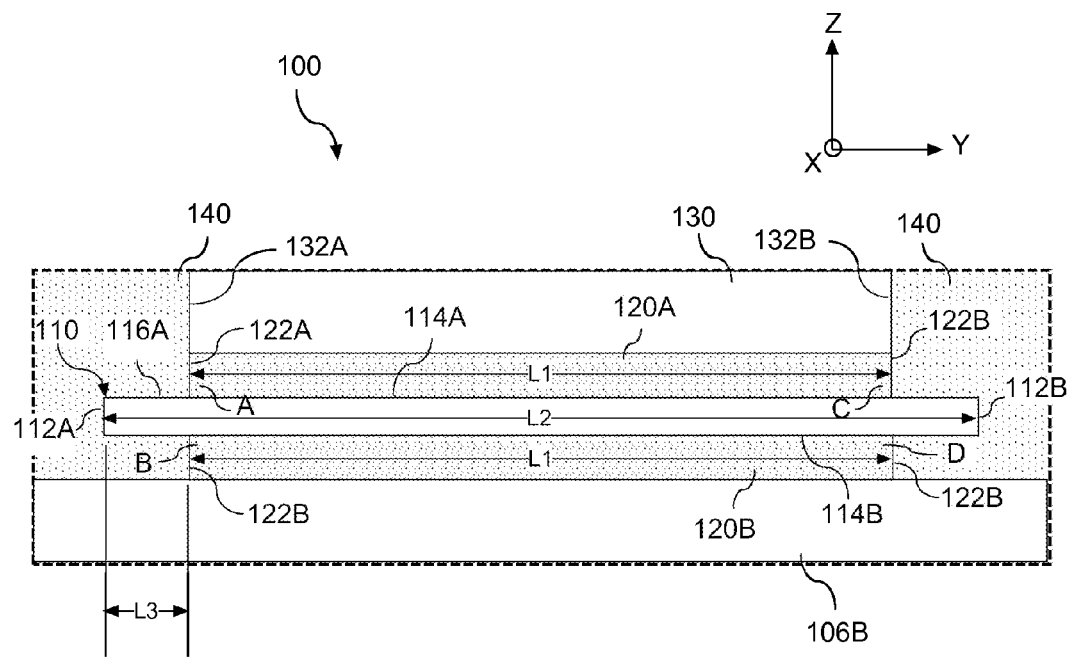
FIG. 2 schematically depicts a close-up, cross-sectional view of the exemplary power electronics module depicted in FIG. 1 according to one or more embodiments described and illustrated herein.

As stated above, embodiments of the present disclosure are directed toward power electronics modules having solder layer configurations to reduce thermally induced stress present at the edge of the solder layer 120A, 120B and the junction of the solder layer 120A, 120B and the power electronics device 110. Referring now to FIG. 2, a close-up view of the power electronics device 110, first and second solder layers 120A, 120B, second heat spreader layer 106B, and thermally conductive spacer 130 of FIG. 1 is provided. Each of the first and second solder layers 120A, 120B have a length L1 along the Y-direction that extend from a first edge 122A to a second edge 122B. Although FIG. 2 depicted the first and second solder layers 120A, 120B as having equal length, embodiments are not limited thereto. For example, the second solder layer 120B may be longer than the first solder layer 120A or vice versa. The first solder layer 120A is disposed on a first surface 114A of the power electronics device 110, and the second solder layer 120B is disposed on a second surface 114B of the power electronics device 110.

The power electronics device 110 has a length L2 along the Y-direction that extends from a first edge 112A to a second edge 112B ("device length"). The device length L2 of the power electronics device 110 is greater than the length L1 of the first and second solder layers 120A, 120B such that perimeter portions 116 of the power electronics device 110 extend beyond the first and second edges 122A, 122B of the first and second solder layers 120A, 120B along the Y-direction. It is noted that, in some embodiments, the power electronics device 110 is square or rectangular in shape, and that a length (not shown) of the power electronics device 110 along the X-direction is also longer than a length of the first and second solder layers 120A, 120B along the X-direction. Additionally, the power electronics device 110 may also be circular or elliptical in shape. In other words, the power electronics device 110 has a footprint (i.e., an area) that is greater than the footprint of the first and second solder layers 120A, 120B such that perimeter portions 116 of the power electronics device 110 extend beyond the first and second solder layers 120A, 120B.

In the illustrated embodiment, the first and second edges 132A, 132B of the thermally conductive spacer 130 are aligned with the edges 122A, 122B of the first solder layer 120A. However, in other embodiments, the thermally conductive spacer 130, if present, may be longer than the first solder layer 120A.

It is noted that, in some embodiments, at least one of the first and second solder layers 120A, 120B has a length that is substantially equal to the length L2 of the power electronics device 110. For example, the second solder layer may have a length that is smaller than the length L2 of the power electronics device 110 (e.g., length L2), while the first solder layer may have a length equal to the length L2 of the power electronics device.

In the embodiment illustrated in FIG. 2, portions 116 of the power electronics device 110 extend beyond the edges 122A, 122B of the first and second solder layers 120A, 120B by a length L3. By making the area of the first and second solder layers 120A, 120B smaller than the area of the power electronics device 110, and thereby providing the overhanging portions 116, the thermally induced maximum stress, particularly at regions labeled A, B, C, and D, is reduced. A computer simulation was performed to verify reduced maximum von Misses stress at the edge of the solder layers (e.g., areas A-D) when the power electronics device extends beyond the solder layers as compared to the case where the solder layers extend to the edges of the power electronics device. A square power electronics device having thermal properties of SiC and a length L1=10.0 mm with a top and bottom solder layer (having thermal properties of SnCu) leaving a 1.0 mm overhang (L3=1.0 mm) around the perimeter of the power electronics device was subjected to a two-dimensional simulation. A square power electronics device of the same dimensions but fully covered by first and second solder layers was also simulated. The maximum von Misses stress $\sigma_{max}$ experienced by the solder layers at areas A-D when a thermal load was simulated at the power electronics device was reduced by 47% in the device with the overhanging portions (i.e., smaller solder layers) compared with the device without the overhanging portions ($\sigma_{max}$ 453 MPa versus $\sigma_{max}$ 241 MPa).

Figure 3:
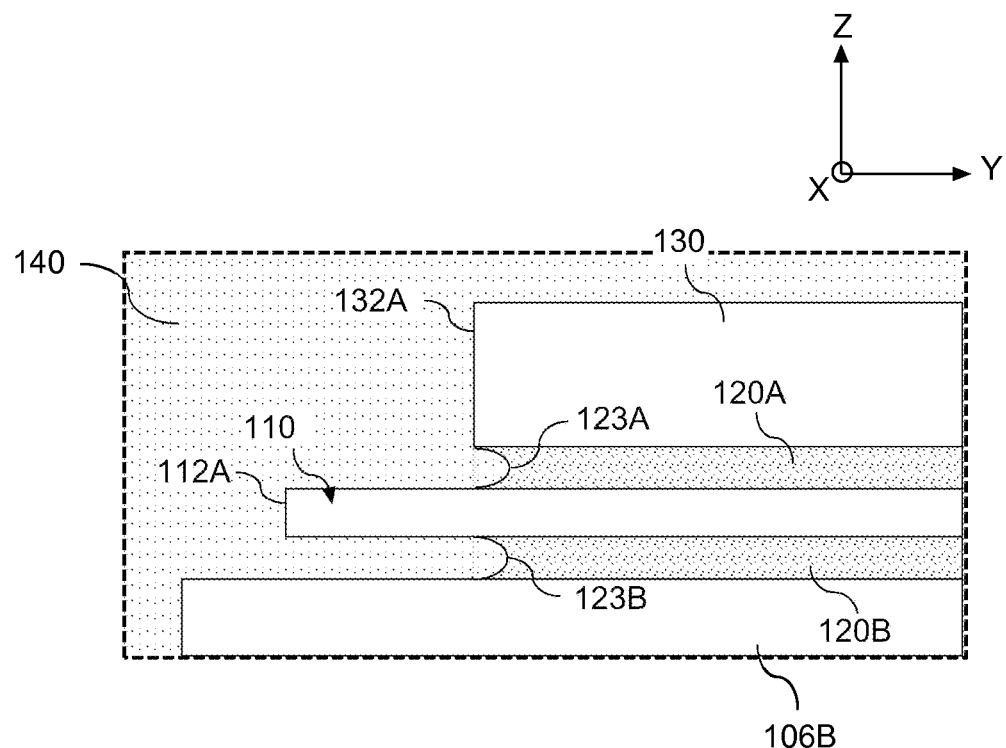
FIG. 3 schematically depicts a close-up, cross-sectional view of at least a first edge of a power electronics module and adjacent solder layers having a curved edge according to one or more embodiments described and illustrated herein.

Although FIGS. 1 and 2 depict solder layers having a straight edge 122A, 122B and a length that is shorter than the length of the power electronics device 110, embodiments are not limited thereto. FIG. 3 schematically depicts a close-up view of a first edge 112A of a power electronics device 110 wherein the first and second solder layers 120A, 120B each have a curved edge 123A, 123B, respectively, that curve inwardly toward a center of the power electronics module 100. The curved edges 123A, 123B may define an "hourglass" shape, for example.

Figure 4:
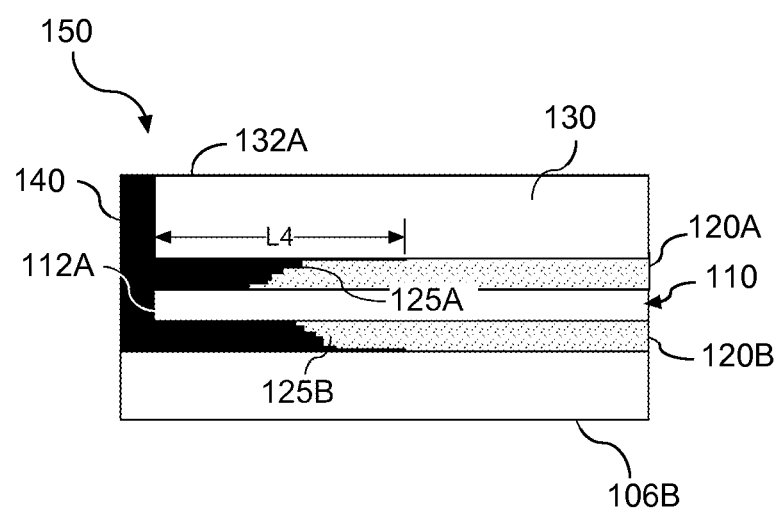
FIG. 4 schematically depicts a multiphysics optimization result showing an exemplary solder layer configuration according to one or more embodiments described and illustrated herein.

FIG. 4 depicts a multiphysics optimization result 150 showing a particular solder layer configuration for a power electronics module to reduce thermally induced stresses at the edges of the solder layers. In the illustrated embodiment, which depicts a close-up view of a first edge 112A of a power electronics device 110, the first solder layer 120A has a first tapered portion 125A, and the second solder layer 120B has a second tapered portion 125B. It is noted that the configuration of the exemplary power electronics module 100 is symmetrically similar at the opposite end that is not shown (i.e., the end having the second edge 112B of the power electronics device 110). Each of the first and second tapered portions 125A, 125B begins at a length L4 (e.g., 1.0 mm) from the first edge 112A of the power electronics device 110. The edge 132A of the thermally conductive spacer 130, if provided, may or may not be aligned with the first edge 112A of the power electronics device 110. Thermally induced stress on the solder layers 120A, 120B may further be reduced by having a tapered edge configuration.

Figure 5:
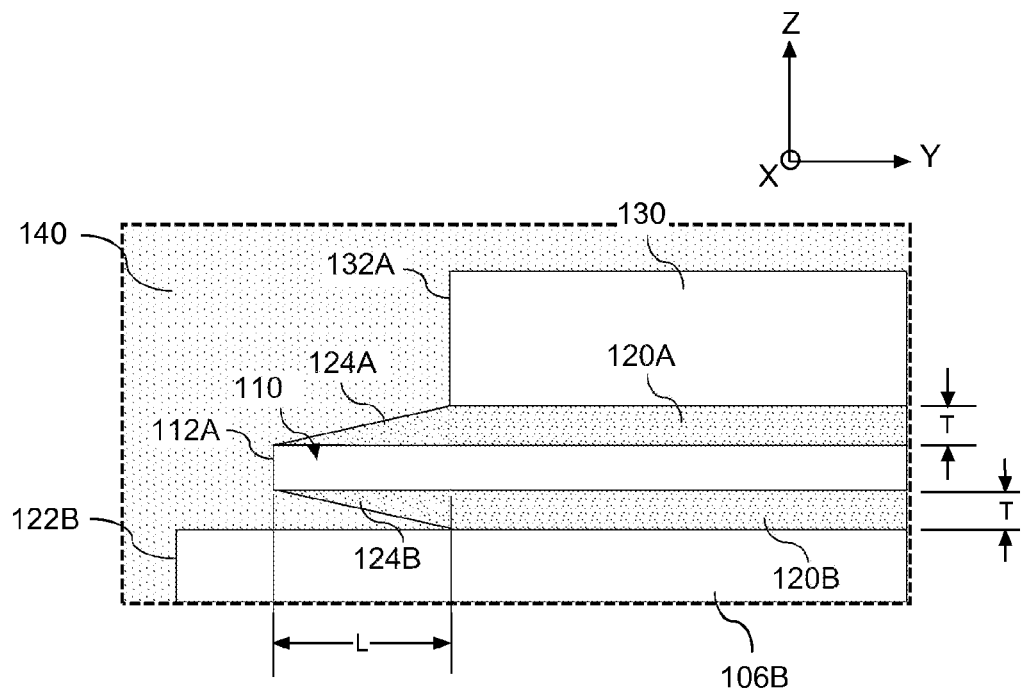
FIG. 5 schematically depicts a close-up, cross-sectional view of at least a first edge of the power electronics module and adjacent solder layers having tapered solder portions according to one or more embodiments described and illustrated herein.

Referring now to FIG. 5, another solder layer configuration is schematically depicted proximate the first edge 112A of the power electronics device 110. It is noted that the power electronics module 100 depicted in FIG. 5 is symmetrical about the Z-axis, and only a portion of one half of the power electronics module 100 is depicted for ease of illustration. In the illustrated embodiment, first and second solder layers 120A, 120B have a maximum thickness T that extends a length (e.g., length L1 depicted in FIG. 2) that extends over a portion of the power electronics device such that the length of the first and second solder layers 120A, 120B having the maximum thickness T is less than the device length L2 (see FIG. 2). The thickness of the first and second solder layers 120A, 120B decreases toward the edge of the power electronics device 110, thereby defining tapered solder portions 124A, 124B. In the illustrated embodiment, the tapered solder portions 124A, 124B extend all the way to the first edge 112A over a taper length L. It should be understood that tapered solder portions 124A, 124B also extend all the way to the second edge 112B (not shown) as well as the edges along the X-direction (not shown). As an example and not a limitation, the taper length L may be about 1.0 mm. However, other taper lengths may be utilized. Further, in other embodiments, the ends of the tapered solder portions 124A, 124B may terminate prior to the edges of the power electronics device 110, thereby leaving portions of the power electronics device uncovered by solder.

Figure 6:
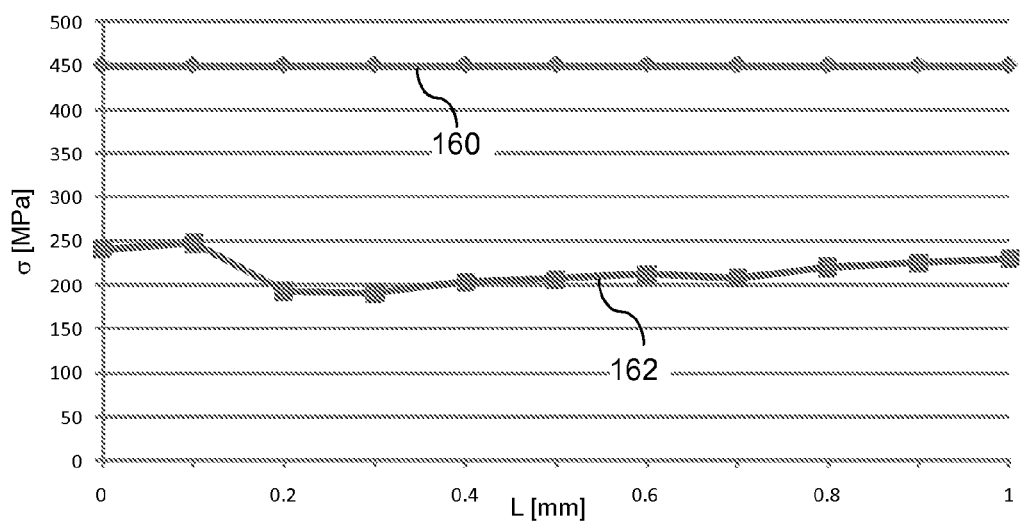
FIG. 6 graphically depicts a maximum von Mises stress σ as a function of taper length of tapered solder portions of first and second solder layers adjacent to a power electronics module according to one or more embodiments described and illustrated herein.

The tapered solder portions 124A, 124B may provide additional stress relief within the first and second solder layers 120A, 120B over first and second solder layers 120A, 120B having a straight edge. Referring now to FIG. 6, curve 162 plots the maximum von Mises stress σ in MPa for tapered solder portions having taper lengths L from 0.0 mm (i.e., straight edge) to 1.0 mm (i.e., to the first edge 112A of the power electronics device 110 in an example embodiment) as measured from the beginning of the tapered solder portion 124A, 124B to the end of the taper solder portions 124A, 124B. A taper length of 0.0 mm describes an embodiment without tapered solder portions, such as the embodiment depicted in FIG. 2, for example. A taper length L for a tapered solder portion of 1.0 mm may describe the embodiment depicted in FIG. 5, wherein the tapered solder portions 124A, 124B fully extend to the edges (e.g., first edge 112A) of the power electronic device. Curve 160 depicts the maximum von Mises stress σ (about 450 MPa) of a comparative example wherein the first and second solder layers fully extend to the edges of the power semiconductor device at a maximum thickness T. As shown in curve 162, a taper length L of about 0.2 mm or about 0.3 mm provides a maximum von Mises stress σ within the first and second solder layers 120A, 120B of about 195 MPa, which is less than about 245 MPa in the case where the first and second solder layers 120A, 120B do not include tapered solder portions, and have straight edges, such as straight edges that are aligned with the edge 132A of the thermally conductive spacer 130, for example. However, the maximum von Mises stress σ of embodiments having solder layers with straight edges and a length less than the device length of the power electronics device, as well as embodiments having tapered solder portions, is less than the comparative example where the solder layers fully extend to the edges of the power electronics device at a maximum thickness T.

It should now be understood that embodiments described herein are directed to power electronics modules having solder layer configurations that are designed to reduce thermally induced stress within the solder layers. A reduction in thermally induced stress may reduce failure in the solder layers, particularly in embodiments wherein the power electronics device is fabricated from silicon carbide. More particularly, embodiments may include solder layers having a surface area that is less than a surface area of the power electronics device such that portions of the power electronics device about the perimeter overhang the solder layers. Such a configuration may reduce the maximum von Mises stress in the solder layers. Embodiments may also include tapered solder portions having a thickness that decreases from a maximum thickness and extend either fully or partially toward the edges of the power electronics device to further reduce thermally induced stress in the solder layers.

It is noted that the term "substantially" or "about" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics module comprising:
   a power electronics device comprising a first surface, a second surface opposite from the first surface, a first edge, and a second edge opposite the first edge, the power electronics device having a device length measured from the first edge to the second edge;
   a first solder layer adjacent to the first surface of the power electronics device;
   a second solder layer adjacent to the second surface of the power electronics device, wherein the first solder layer and the second solder layer have a maximum thickness T along a length that is less than the device length of the power electronics device;
   a first thermally conductive layer adjacent to the first solder layer, wherein the first solder layer thermally couples the first thermally conductive layer to the first surface of the power electronics device;
   a second thermally conductive layer adjacent to the second solder layer, wherein the second solder layer thermally couples the second thermally conductive layer to the second surface of the power electronics device; and
   a thermally conductive sealing material, wherein:
      the thermally conductive sealing material contacts a portion of the first surface of the power electronics device and a portion of the second surface of the power electronics device; and
      the thermally conductive sealing material contacts the first solder layer, the second solder layer, the first thermally conductive layer, and the second thermally conductive layer.

2. The power electronics module of claim 1, wherein the power electronics device is fabricated from silicon carbide.

3. The power electronics module of claim 1, wherein the first solder layer and the second solder layer each comprise a curved edge.

4. The power electronics module of claim 1, wherein a thickness of the first solder layer and the second solder layer decreases from the maximum thickness T toward the first edge and the second edge of the power electronics device, thereby forming tapered solder portions on the first surface and the second surface of the power electronics device.

5. The power electronics module of claim 1, wherein:
the first thermally conductive layer is a thermally conductive spacer;
the power electronics module further comprise a first heat spreader layer thermally coupled to a surface of the thermally conductive spacer;
the second thermally conductive layer is a second heat spreader layer; and
the power electronics module further comprises a first cooler device bonded to the first heat spreader layer, and a second cooler device bonded to the second heat spreader layer.

6. A power electronics module comprising:
a power electronics device comprising a first surface, a second surface opposite from the first surface, a first edge, and a second edge opposite the first edge, the power electronics device having a device length measured from the first edge to the second edge;
a first solder layer adjacent to the first surface of the power electronics device, the first solder layer having a length that is less than the device length of the power electronics device;
a second solder layer adjacent to the second surface of the power electronics device, the second solder layer having a length that is less than the device length of the power electronics device, wherein portions of the power electronics device extend beyond the first solder layer and the second solder layer;
a first thermally conductive layer adjacent to the first solder layer, wherein the first solder layer thermally couples the first thermally conductive layer to the first surface of the power electronics device;
a second thermally conductive layer adjacent to the second solder layer, wherein the second solder layer thermally couples the second thermally conductive layer to the second surface of the power electronics device; and
a thermally conductive sealing material, wherein:
portions of the power electronics device extend beyond an edge of the first solder layer and an edge of the second solder layer; and
the thermally conductive sealing material contacts a portion of the first surface of the power electronics device and a portion of the second surface of the power electronics device.

7. The power electronics module of claim 6, wherein the power electronics device comprises at least one electrode on the first surface or the second surface, and the at least one electrode does not contact the first solder layer or the second solder layer.

8. The power electronics module of claim 6, wherein the power electronics device is fabricated from silicon carbide.

9. The power electronics module of claim 6, wherein the first solder layer and the second solder layer each comprise a curved edge.

10. The power electronics module of claim 6, wherein a thickness of the first solder layer and the second solder layer decreases from a maximum thickness T toward the first edge and the second edge of the power electronics device, thereby forming tapered solder portions on the first surface and the second surface of the power electronics device.

11. The power electronics module of claim 6, wherein:
the first thermally conductive layer is a thermally conductive spacer;
the power electronics module further comprise a first heat spreader layer thermally coupled to a surface of the thermally conductive spacer;
the second thermally conductive layer is a second heat spreader layer; and
the power electronics module further comprises a first cooler device thermally coupled to the first heat spreader layer, and a second cooler device thermally coupled to the second heat spreader layer.

12. The power electronics module of claim 6, wherein the power electronics module further comprises a first cooler device thermally coupled to the first thermally conductive layer, and a second cooler device thermally coupled to the second thermally conductive layer.

13. A power electronics module comprising:
a power electronics device comprising a first surface, a second surface opposite from the first surface, a first edge, and a second edge opposite the first edge, wherein:
a first solder layer adjacent to the first surface of the power electronics device, and a second solder layer adjacent to the second surface of the power electronics device;
the first solder layer and the second solder layer each have a maximum thickness T;
a thickness of the first solder layer and the second solder layer decreases from the maximum thickness T toward the first edge and the second edge of the power electronics device, thereby defining tapered solder portions on the first surface and the second surface of the power electronics device;
a first thermally conductive layer adjacent to the first solder layer, wherein the first solder layer thermally couples the first thermally conductive layer to the first surface of the power electronics device;
a second thermally conductive layer adjacent to the second solder layer, wherein the second solder layer thermally couples the second thermally conductive layer to the second surface of the power electronics device; and
a thermally conductive sealing material surrounding portions of the power electronics device, the first solder layer, the second solder layer, the first thermally conductive layer, and the second thermally conductive layer, wherein:
portions of the power electronics device extend beyond an edge of the first solder layer and an edge of the second solder layer; and
the thermally conductive sealing material contacts a portion of the first surface of the power electronics device and a portion of the second surface of the power electronics device.

14. The power electronics module of claim 13, wherein the power electronics device comprises at least one electrode on the first surface or the second surface, and the at least one electrode does not contact the first solder layer or the second solder layer.

15. The power electronics module of claim 13, wherein the power electronics device is fabricated from silicon carbide.

16. The power electronics module of claim 13, wherein:
the first thermally conductive layer is a thermally conductive spacer;
the power electronics module further comprise a first heat spreader layer thermally coupled to a surface of the thermally conductive spacer;

the second thermally conductive layer is a second heat spreader layer; and the power electronics module further comprises a first cooler device bonded to the first heat spreader layer, and a second cooler device bonded to the second heat spreader layer.

17. The power electronics module of claim 13, wherein the power electronics module further comprises a first cooler device thermally coupled to the first thermally conductive layer, and a second cooler device thermally coupled to the second thermally conductive layer.

* * * * *